United States Patent
Spann

(10) Patent No.: US 9,929,066 B1
(45) Date of Patent: Mar. 27, 2018

(54) POWER SEMICONDUCTOR DEVICE MODULE BASEPLATE HAVING PERIPHERAL HEELS

(71) Applicant: IXYS Corporation, Milpitas, CA (US)

(72) Inventor: Thomas Spann, Fuerth (DE)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 15/378,011

(22) Filed: Dec. 13, 2016

(51) Int. Cl.
| | |
|---|---|
| *H01L 23/34* | (2006.01) |
| *H01L 23/057* | (2006.01) |
| *H01L 23/367* | (2006.01) |
| *H01L 21/52* | (2006.01) |
| *H01L 23/08* | (2006.01) |
| *H01L 21/48* | (2006.01) |
| *H01L 23/40* | (2006.01) |

(52) U.S. Cl.
CPC ........ *H01L 23/057* (2013.01); *H01L 21/4882* (2013.01); *H01L 21/52* (2013.01); *H01L 23/08* (2013.01); *H01L 23/3675* (2013.01); *H01L 2023/4031* (2013.01); *H01L 2023/4087* (2013.01)

(58) Field of Classification Search
CPC ....... H01L 23/057; H01L 23/36; H01L 21/52; H01L 21/4882; H01L 23/3675
See application file for complete search history.

(56) References Cited

U.S. PATENT DOCUMENTS

| | | | | |
|---|---|---|---|---|
| 5,629,562 | A * | 5/1997 | Nomura | H01L 23/13 257/683 |
| 7,910,952 | B2 * | 3/2011 | Tschirbs | H01L 23/3735 257/177 |
| 8,455,987 | B1 | 6/2013 | Spann et al. | 257/675 |
| 8,587,019 | B2 | 11/2013 | Yan et al. | 257/99 |
| 9,000,580 | B2 | 4/2015 | Groening et al. | 257/717 |
| 9,142,493 | B2 * | 9/2015 | Fujino | H01L 24/27 |
| 9,443,792 | B1 * | 9/2016 | Spann | H01L 23/3735 |

(Continued)

FOREIGN PATENT DOCUMENTS

| | | |
|---|---|---|
| DE | 19609929 A1 | 3/1996 |
| DE | 19707514 C2 | 2/1997 |

(Continued)

*Primary Examiner* — Jamie C Niesz
(74) *Attorney, Agent, or Firm* — Imperium Patent Works; T. Lester Wallace

(57) ABSTRACT

The baseplate of a power semiconductor device module makes reliable and superior thermal contact with a heatsink when fixed to the heatsink. The baseplate includes a rectangular plate portion, a first downward-extending peripheral heel extension portion, and a second downward-extending peripheral heel extension portion. In one example, the plate portion has four mounting holes for receiving mounting bolts. There is one mounting hole located adjacent each of four corners of the rectangular plate portion. The central portion of the bottom surface of the plate portion has a slightly convex downward shape. The strip-shaped first heel extension portion extends along a first edge of the bottom surface. The strip-shaped second heel extension portion extends along a second edge of the bottom surface opposite the first edge. Each of the first and second heel extension portions extends downward from the bottom surface for a distance of between thirty and five hundred microns.

16 Claims, 10 Drawing Sheets

ACCENTUATED AND SIMPLIFIED CROSS-SECTIONAL SIDE VIEW
OF BASEPLATE BEING ATTACHED TO A HEATSINK

(56) References Cited

U.S. PATENT DOCUMENTS

2013/0056185 A1* 3/2013 Bayerer .................. H01L 23/36
                                                     165/134.1
2016/0071778 A1* 3/2016 Otsubo ................. H01L 21/486
                                                     257/687
2016/0225688 A1* 8/2016 Saito .................... H01L 23/367

FOREIGN PATENT DOCUMENTS

| DE | 102006011995 B3 | 3/2006 |
|----|-----------------|--------|
| EP | 1501127 B1 | 6/2004 |
| WO | WO 01/08219 A1 | 7/1999 |

* cited by examiner

POWER SEMICONDUCTOR DEVICE MODULE

POWER SEMICONDUCTOR DEVICE MODULE
(SIDE VIEW)

POWER SEMICONDUCTOR DEVICE MODULE
(CROSS-SECTIONAL SIDE VIEW)

METAL BASEPLATE
(TOP-DOWN VIEW)

METAL BASEPLATE
(CROSS-SECTIONAL SIDE VIEW)

LEFT SIDE EDGE OF METAL BASEPLATE
(EXPANDED SIDE VIEW)

VIEW OF THE BOTTOM
OF THE BASEPLATE

CONVEXNESS OF THE BOW OF THE BASEPLATE

ACCENTUATED AND SIMPLIFIED CROSS-SECTIONAL SIDE VIEW
OF A PRIOR ART BASEPLATE BEING ATTACHED TO A HEATSINK

ACCENTUATED AND SIMPLIFIED CROSS-SECTIONAL SIDE VIEW
OF A PRIOR ART BASEPLATE BEING ATTACHED TO A HEATSINK

ACCENTUATED AND SIMPLIFIED CROSS-SECTIONAL SIDE VIEW
OF A PRIOR ART BASEPLATE BEING ATTACHED TO A HEATSINK

ACCENTUATED AND SIMPLIFIED CROSS-SECTIONAL SIDE VIEW
OF A PRIOR ART BASEPLATE BEING ATTACHED TO A HEATSINK

ACCENTUATED AND SIMPLIFIED CROSS-SECTIONAL SIDE VIEW
OF A PRIOR ART BASEPLATE BEING ATTACHED TO A HEATSINK

THERMAL IMPRINT MAP FOR THE BASEPLATE ATTACHMENT
SHOWN IN FIG. 12

ACCENTUATED AND SIMPLIFIED CROSS-SECTIONAL SIDE VIEW
OF BASEPLATE BEING ATTACHED TO A HEATSINK

ACCENTUATED AND SIMPLIFIED CROSS-SECTIONAL SIDE VIEW
OF BASEPLATE BEING ATTACHED TO A HEATSINK

TORQUE IS COUNTERCLOCKWISE

ACCENTUATED AND SIMPLIFIED CROSS-SECTIONAL SIDE VIEW
OF BASEPLATE BEING ATTACHED TO A HEATSINK

TORQUE IS CLOCKWISE

ACCENTUATED AND SIMPLIFIED CROSS-SECTIONAL SIDE VIEW
OF BASEPLATE BEING ATTACHED TO A HEATSINK

THERMAL IMPRINT MAP

THERMAL IMPRINT MAP

ANOTHER EMBODIMENT OF THE METAL BASEPLATE
(EXPANDED SIDE VIEW)

ANOTHER EMBODIMENT OF THE METAL BASEPLATE
(TOP-DOWN VIEW)

ANOTHER EMBODIMENT OF THE METAL BASEPLATE
(TOP-DOWN VIEW)

ANOTHER EMBODIMENT OF THE METAL BASEPLATE
(TOP-DOWN VIEW)

POWER SEMICONDUCTOR DEVICE MODULE BASEPLATE HAVING PERIPHERAL HEELS

TECHNICAL FIELD

The described embodiments relate to baseplates for power semiconductor device modules.

BACKGROUND INFORMATION

Power semiconductor device modules often have metal baseplates. When employed in a larger device, the module is typically fixed to a heatsink. Generally, an amount of thermal grease or a thermally conductive pad or a thermally conductive phase change material is disposed between the bottom metal surface of the baseplate and the top metal surface of the heatsink. It is desirable that there be good thermal transfer from electronic devices inside the module, through the baseplate, through any intervening amount of thermal grease or thermal pad or thermally conductive phase change material, and to the heatsink.

SUMMARY

A power semiconductor device module includes a metal baseplate and a plastic housing frame that together form a shallow tray. Power electronic circuitry is disposed in the shallow tray under a layer of an encapsulant, such as silicone gel. A plastic cap covers the tray so as to enclose the power electronics and the silicone layer within a shallow housing. A plurality of electrical terminals (electrical press-fit terminals or electrical solderable terminals) is disposed along the periphery of the tray. Each electrical terminal has a lower portion and an upper portion. The lower portion in one example includes a laterally-extending landing pad. The electronics in the tray is then coupled, for example by wire bonds, to the landing pads of the various terminals. The upper portion of each electrical terminal sticks up through a corresponding hole in the cap and extends away from the top of the cap in a direction that is perpendicular to the plane of the bottom surface of the metal baseplate.

The metal baseplate is a rectangular, or substantially rectangular, plate of metal. Adjacent each of four corners of the baseplate there is a corresponding one of four corner mounting holes. (In an E2-module example there are only two mounting holes, one located midway along one side of the baseplate and another located midway along an opposite side of the baseplate.) The baseplate includes a rectangular, or substantially rectangular, plate portion as well as four upward-extending cylindrical extension portions. Each upward-extending cylindrical extension portion extends up from the plane of an upper surface of the plate portion. An unthreaded corner mounting hole extends vertically downward through the cylindrical extension portion and then on downward through the plate portion to the bottom surface of the baseplate. There are four such upward-extending cylindrical extension portions (each forming one corner mounting hole). There is one upward-extending cylindrical extension portion disposed adjacent each corner of the baseplate.

The bottom surface of the baseplate is a rectangular, or substantially rectangular, substantially planar surface. Each corner mounting hole extends axially in a direction perpendicular to the plane of the bottom surface of the baseplate. More specifically, the bottom surface of the baseplate actually is very slightly convex shaped such that the center portion of the bottom surface extends downward a bit more than the peripheral portions of the bottom surface where the corner mounting holes are located. The bottom surface of the baseplate is convex when the module is considered from the bottom. Despite this slight downward convex bow, the bottom surface of the baseplate is said to extend in the bottom plane because the convex bow is so very slight.

In a novel aspect, the baseplate also includes one or more peripheral heel extension portions disposed along two opposing edges of the bottom of the baseplate. In one example, there is a first plurality of peripheral heel extension portions disposed along one bottom edge (for example, the leftmost bottom edge) of the rectangular bottom surface of the baseplate, and there is a second plurality of peripheral heel extension portions disposed along the opposite bottom edge (for example, the rightmost bottom edge) of the rectangular bottom surface of the baseplate. Each of these heel extension portions is a thin strip of metal of the baseplate that extends downward from the plane of the bottom surface. All the heel extension portions of a given baseplate extend down the same small distance, which is between thirty microns (micron=μm) and five hundred microns. The peripheral heel extension portions of the first plurality are disposed in a collinear relationship with respect to one another. The peripheral heel extension portions of the second set are disposed in a collinear relationship with respect to one another. When the baseplate is considered from the side perspective, the first plurality of heel extension portions is disposed along the leftmost bottom edge of the baseplate, and the leftmost two corner mounting holes are disposed slightly inward of first plurality of heel extension portions. Similarly, when the baseplate is considered from this same side perspective, the second plurality of heel extension portions is disposed along the rightmost bottom edge of the baseplate, and the rightmost two corner mounting holes are disposed slightly inward of second plurality of heel extension portions. When considered from this same side perspective, the bottom surface of the baseplate bows downward slightly in the central region of the baseplate between the leftmost pair of corner mounting holes and the rightmost pair of corner mounting holes.

Further details, embodiments, techniques and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings. In the description and claims below, when a first object is referred to as being disposed "over" or "on" or "onto" a second object, it is to be understood that the first object can be directly on the second object, or an intervening object may be present between the first and second objects. Similarly, terms such as "upper", "top", "up", "down", "downward", "upward", "vertically", "horizontally", "laterally", "lower", "under", "below" and "bottom" are used herein to describe relative orientations between different parts of the structure being described, and it is to be understood that the overall structure being described can actually be oriented in any way in three-dimensional space.

Figure 1:
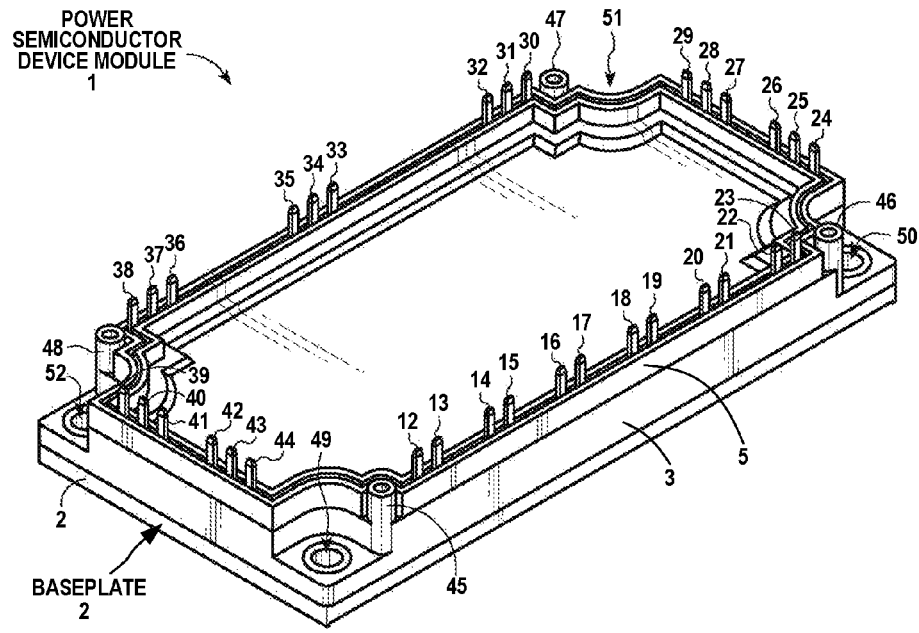
FIG. 1 is a top-down perspective diagram of a power semiconductor device module in accordance with one novel aspect.
Figure 2:
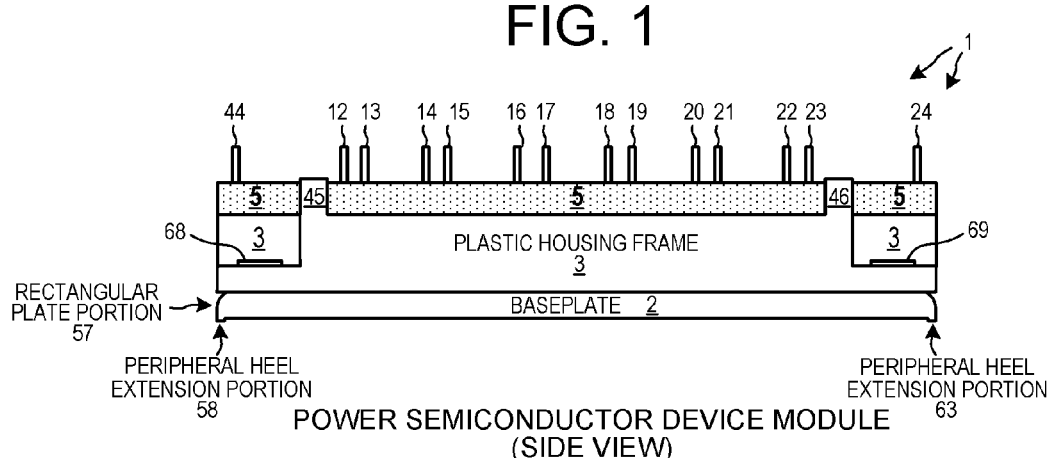
FIG. 2 is a side view of the power semiconductor device module of FIG. 1.
Figure 3:
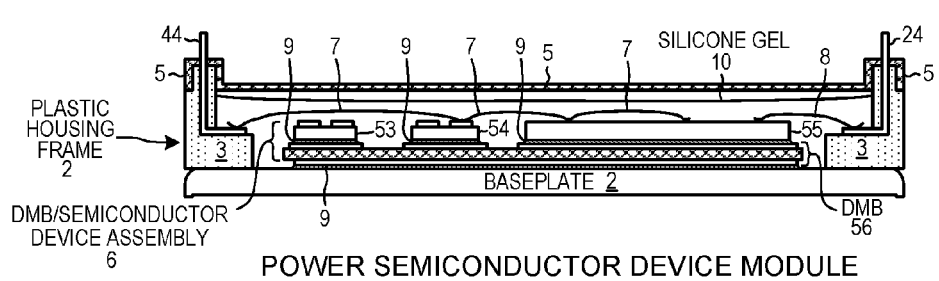
FIG. 3 is a cross-sectional side view of the power semiconductor device module of FIG. 1.

FIG. 1 is a top-down perspective diagram of a power semiconductor device module 1 in accordance with one novel aspect. FIG. 2 is a side view of the power semiconductor device module 1 of FIG. 1. FIG. 3 is a cross-sectional side view of the power semiconductor device module 1 of FIG. 1. Power semiconductor device module 1 includes a novel metal baseplate 2, an injection molded plastic housing frame 3, an injection molded plastic cap 5, a Direct Metal Bonded (DMB)/semiconductor device assembly 6, bond wires (two of which are illustrated and labeled 7 and 8), amounts of solder 9, an amount of silicone gel encapsulant 10, and a plurality of electrical terminals 12-44. The electrical terminals may, for example, be either press-fit terminals or solderable terminals. Reference numerals 45-48 identify cylindrical extension portions of the plastic housing. Reference numerals 49-52 identify four mounting holes. For additional background information on this type of power semiconductor device module, see U.S. Pat. No. 9,443,792 (the entire content of which is incorporated herein by reference). The power semiconductor device module 1 of FIG. 1 is like the semiconductor device module set forth in U.S. Pat. No. 9,443,792, but for the novel metal baseplate 2 and details of the bottom of the injection molded plastic frame housing 3.

As pictured in FIG. 3, the injection molded plastic housing frame 3 fits down onto and engages the metal baseplate 2 so as to form a central shallow tray-shaped recess or depression. The plastic housing frame may, for example, be glued to or otherwise engage the metal baseplate so that the shallow tray is formed. The plastic housing frame 3 extends around and frames a central portion of the top surface of the metal baseplate 2. The central portion of the top surface of the metal baseplate is the bottom of the tray. Solder-joined to this central portion of the top surface of the baseplate is the DMB/semiconductor device assembly 6. Covering this DMB/semiconductor device assembly 6 is the layer of the silicone gel encapsulant 10. Plastic cap 5 fits down over the top of the tray to cover the encapsulant and the open face of the tray. As shown in FIG. 1, the upward-extending electrical terminals 12-44 are disposed in a ring that extends around the peripheral edge of the plastic housing frame 3. Each electrical terminal has a lower portion and an upper portion. The lower portion in one example includes a laterally-extending landing pad. The laterally-extending landing pads of the terminals are electrically coupled to various points of the electrical circuit of the DMB/semiconductor device assembly 6 within the module via bond wires. Only two of these bond wires 7 and 8 are seen in the particular cross-section shown in FIG. 3. The power semiconductor device module 1 can be attached to a heatsink via screws or bolts (not shown) through the unthreaded mounting holes 49-52 so that the bottom surface of the baseplate 2 is pressed against the heatsink to be in good thermal contact with the heatsink. The DMB/semiconductor device assembly 6 includes multiple power semiconductor device dice 53-55 and a DMB 56. The dice 53-55 are surface-mount soldered to the top of DMB 56. The bottom of DMB 56 is soldered to the top surface of baseplate 2.

The baseplate 2, as is described in further detail below, includes a rectangular plate portion 57, a plurality of upward-extending cylindrical portions 68-71, and a plurality of downward-extending peripheral heel portions 58-67. The tops of two of the upward-extending cylindrical portions 68 and 69 are seen from the vantage of FIG. 5. The sides of two of the downward-extending peripheral heel portions 58 and 63 are seen from the vantage of FIG. 5.

Figure 4:
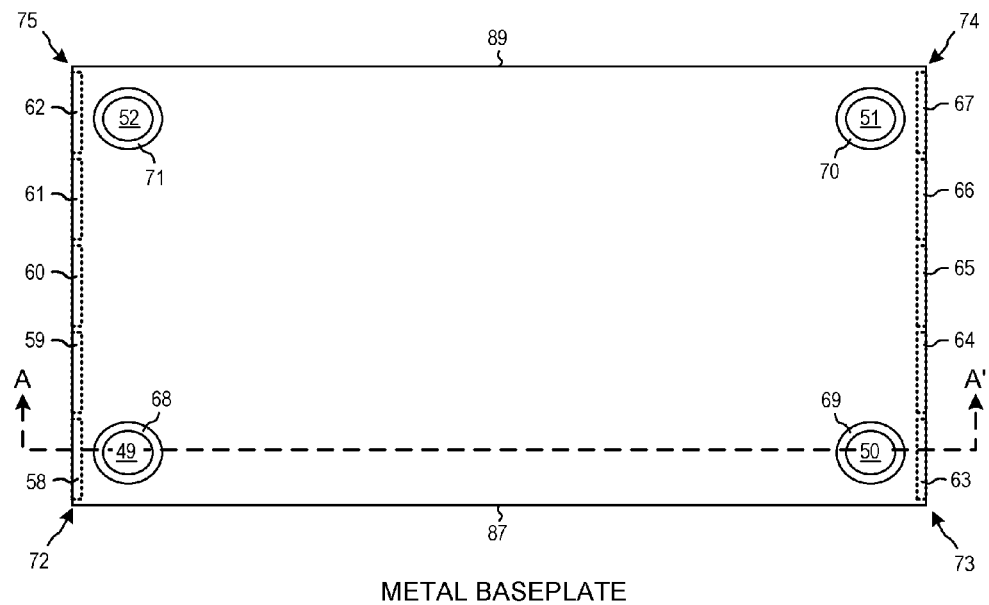
FIG. 4 is a top-down diagram of the baseplate of the power semiconductor device module of FIG. 1.
Figure 5:
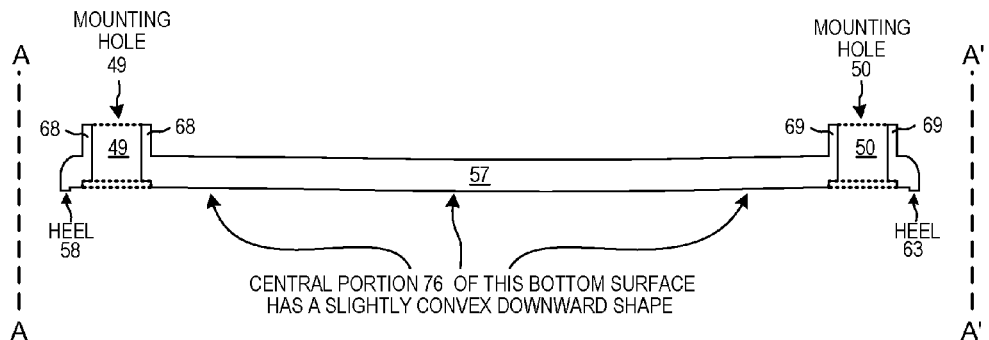
FIG. 5 is a cross-sectional side view of the baseplate of FIG. 4.

FIG. 4 is a top-down view of the metal baseplate 2. FIG. 5 is a cross-sectional side view of the baseplate 2 taken along sectional line A-A' of FIG. 4. From the top-down perspective, the baseplate has a rectangular shape. The bottom of the baseplate has four bottom edges. The bottom edges form a rectangle when the baseplate is considered from the bottom. The baseplate includes the rectangular block-shaped plate portion 57, a first plurality of downward-extending peripheral heel portions 58-62, a second plurality of downward-extending heel portions 63-67, and the four upward-extending cylindrical portions 68-71. The rectangular block-shaped plate portion 57 is a block of metal that has a rectangular shape when considered from the top-down perspective, and when considered from each of its sides. Plate portion 57 has a thickness of about three millimeters, a width of at least two centimeters, a length of at least six centimeters, a bottom surface and four sides. The bottom surface has a slightly convex downward shape. The bottom surface is slightly bowed in the lengthwise dimension, as well as in the crosswise dimension. The four mounting holes 49-52 are actually holes in the plate portion 57. There is one such mounting hole disposed adjacent each corresponding one of the four corners 72-75 of the plate portion as shown in FIG. 4.

The heel portions 58-62 of the first plurality of downward-extending peripheral heel portions are collinear with respect to one another and are disposed in a first line. These heel portions 58-62 of the first plurality of downward-extending peripheral heel portions extend downward from the bottom surface 78 of the plate portion 57 at the left bottom edge of the baseplate.

The heel portions 63-67 of the second plurality of downward-extending peripheral heel portions are collinear with respect to one another and are disposed in a second line. The second line is parallel to the first line. These heel portions 63-67 of the second plurality of downward-extending peripheral heel portions extend downward from the bottom surface 78 of the plate portion 57 at the right bottom edge of the baseplate.

When the baseplate 2 is considered from the bottom, the peripheral heel portions 58-62 of the first plurality of peripheral heel portions are aligned along the left side of the baseplate, and are extending upward (toward the viewer). Likewise, when the baseplate 2 is considered from the bottom, the peripheral heel portions 63-67 of the second plurality of peripheral heel portions are aligned along the right side of the baseplate, and are extending upward (toward the viewer). Between the left row of peripheral heel portions 58-62 along the left side of the baseplate and the right row of peripheral heel portions 63-67 along the right side of the baseplate is a central portion 76 of the bottom surface 78 of the baseplate. As can be seen from the cross-sectional side view of FIG. 5, this central portion of the bottom surface has a slightly convex downward shape.

Each of the upward-extending cylindrical extension portions 68-71 extends up from the plane of the major top surface of the plate portion. There is one such cylindrical extension portion at each of the corresponding mounting holes. In one example, the baseplate 2 is made from a rectangular block of copper plate that is three millimeters thick. In a pressing operation, metal at the upper edge of the block is deformed downward and metal at the left side of the baseplate is deformed downward to form the peripheral heel portions. The rounding radius that remains at the upper left corner edge of the plate has an approximate radius of up to about 0.5 millimeters. The heel portions stick down from the plane of the major bottom surface of the baseplate by about one hundred microns (within the thirty micron to five hundred micron range). Also, metal that previously occupied the cylindrical volume of the mounting holes is deformed upward in the pressing operation to form the upward-extending cylindrical extension portions 68-71. In this example, the baseplate 2 is an integrally formed unitary piece of copper, that after being press-formed to form the downward extending heel portions and the upward-extending cylindrical extension portion is plated with nickel.

Figure 6:
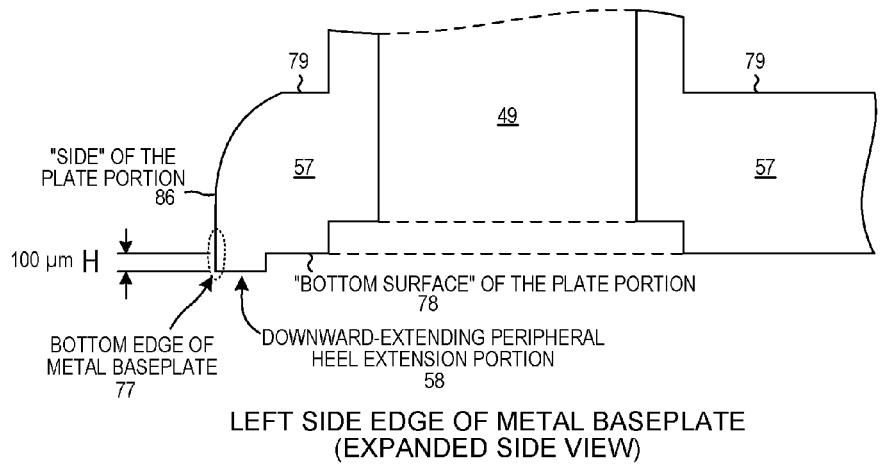
FIG. 6 is an expanded view of the left side of the cross-sectional view of FIG. 5.

FIG. 6 shows a left portion of the A-A' cross-section of FIG. 5, shown in FIG. 6 in expanded form. The entire circled area is said to be a bottom "edge" 77 of baseplate 2. The heel portion 58 is said to extend down from the plate portion 57 of the baseplate at this bottom edge 77. The heel portion 58 extends downward from the bottom surface 78 of the plate portion 57 a distance of H (100 microns). The heel portions 58-67 are made of the appropriate width to accommodate metal that was deformed downward from the plate portion during the press-forming operation. The upward-extending cylindrical extension portions 68-71 extend upward from the plane of the major top surface 79 of the baseplate 2 by about four millimeters.

Figure 7:
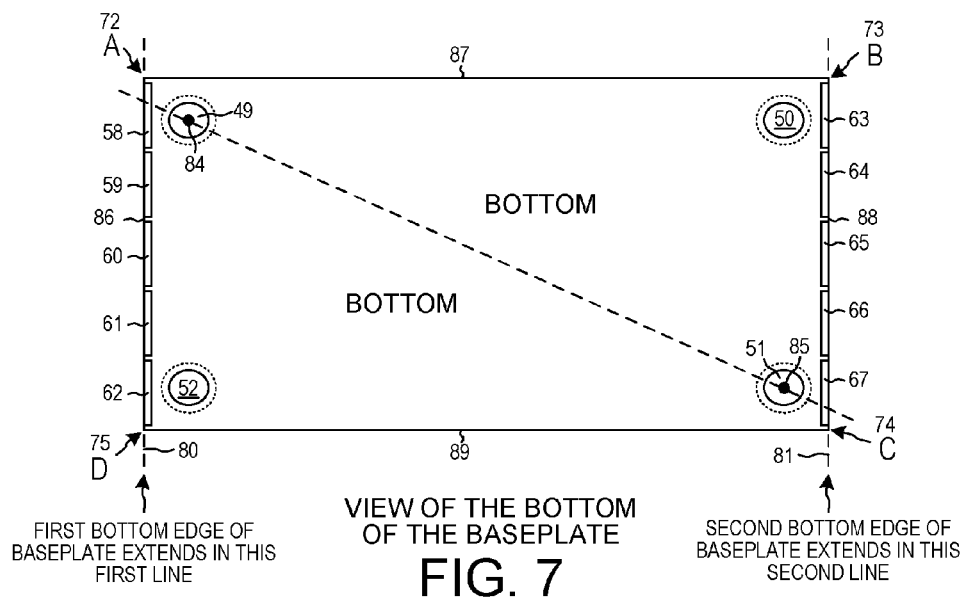
FIG. 7 is a view of the bottom of the baseplate of the FIG. 4.

FIG. 7 is a view of the bottom of the baseplate 2. Each of the peripheral heel portions has an elongated bar shape. The peripheral heel portions of the first plurality of peripheral heel portions extend collinearly in the first line 80. Line 80 extends along the bottom left edge 77 of the plate portion of the baseplate. The peripheral heel portions of the second plurality of peripheral heel portions extend collinearly in the second line 81. Line 81 extends along the bottom right edge of the plate portion of the baseplate. Reference numerals 86-89 identify the four sides of the plate portion 57 of the baseplate.

Figure 8:
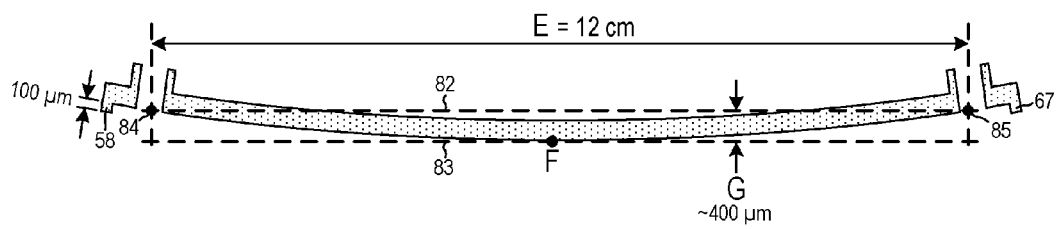
FIG. 8 is a cross-sectional side view that illustrates the convexness of the baseplate of FIG. 4.
Figure 9:
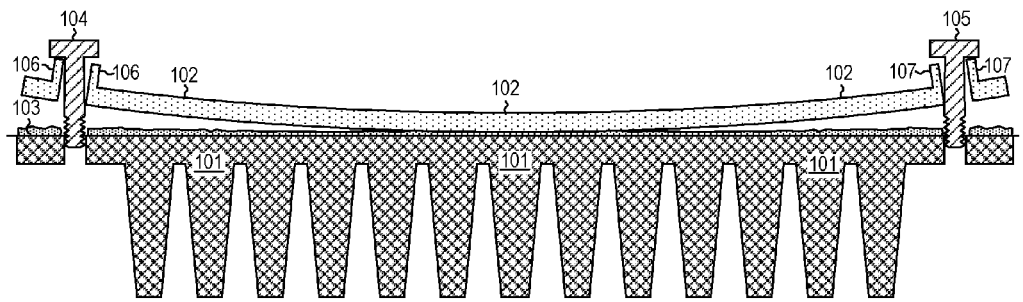
FIG. 9 is a first diagram in a sequence of attaching a conventional module to a heatsink.

FIG. 8 is a cross-sectional diagram that illustrates how the convexness of the bottom surface of the baseplate 2 is specified. The two horizontal lines 82 and 83 are parallel to each other. The upper horizontal line 82 intersects the bottom surface of the baseplate at the level of the axial centers 84 and 85 of the corner mounting holes 49 and 51. The lower horizontal line 83 intersects the lowest point F of the bottom surface of the baseplate between the corner mounting holes 49 and 51. The distance E between the mounting holes 49 and 51 is specified as E. The distance between the horizontal lines 82 and 83 is specified as G. E is twelve centimeters. G is four hundred microns. These values for E and G are one way to specify the degree of convexness of the bottom surface of the baseplate.

State of the art quality in the production of metal baseplates involves a tolerance as to the degree of baseplate convexness. During assembly, the DMB is soldered to the top of the baseplate. During this process, the entire baseplate/solder/DMB assembly is placed into an oven and is heated. The entire assembly then cools. During the cooling, there is a differential degree of thermal contraction between the various parts (the metal baseplate, the solder, the DMB, the dice on the DMB) of the assembly. Accordingly, the resulting forces and stresses imparted on the various parts may cause local variations in bow from one area of the bottom surface of the baseplate to the next area. The resulting module cannot be made to have too much overall average bow or there may be too much flexing of the baseplate as the module is bolted down to a heatsink. Too much flexing can introduce plastic deformation of solder that holds the DMB to the top surface of the baseplate. Such plastic deformation of the solder can introduce tensile stress on the DMB. Flexing of the baseplate can also introduce tensile stress at the die surface where a die is soldered to the top of the DMB. Not only can the baseplate not have too much bow, but also the bottom of the module cannot have too little bow. Too small of a degree of convexness may result in the heatsink not being pressed against the heatsink with enough force and thermal contact. For these reasons, the degree of convexness of the module baseplate is somewhat bounded. For this bounded degree of convexness, if the bolts are only tightened to a low amount of torque, then there may not be enough pressure between module and heatsink, and poor thermal contact between baseplate and heatsink may result. If the bolts are tightened to a high torque, this may reduce the gap (between the bottom of the baseplate and the top of the heatsink at the outer edges of the baseplate) too much, resulting in too much flexing of the baseplate in a way that the center part of the baseplate has a concave area. Under conditions of excessive flexing, there may be local areas of the bottom of the baseplate that are actually concave. As a result, there may be bad thermal contact in these local areas.

Figure 10:
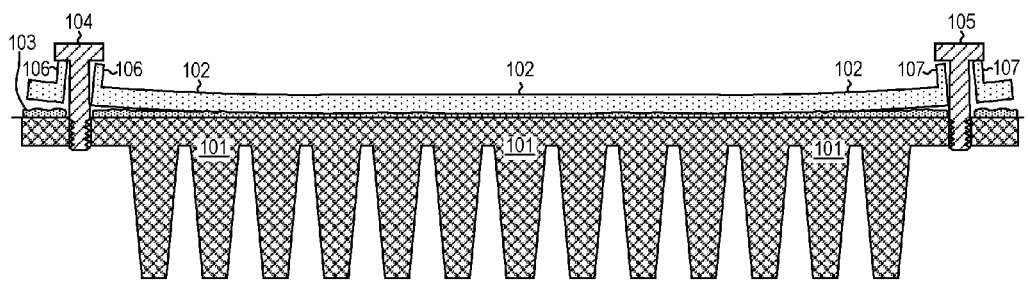
FIG. 10 is a second diagram in the sequence of attaching the conventional module to the heatsink.
Figure 11:
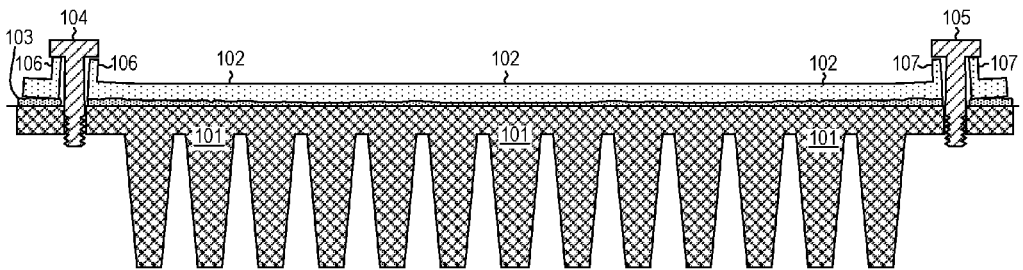
FIG. 11 is a third diagram in the sequence of attaching the conventional module to the heatsink.
Figure 12:
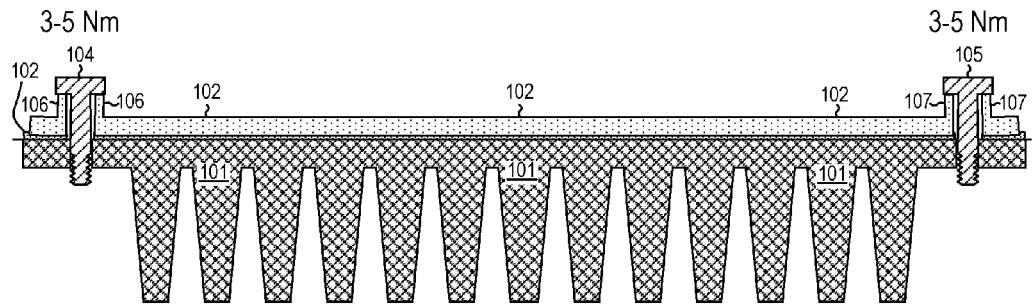
FIG. 12 is a fourth diagram in the sequence of attaching the conventional module to the heatsink

FIGS. 9-12 are cross-sectional diagrams that illustrate a sequence of attaching a conventional module to a heatsink 101. The remainder of the conventional semiconductor device module in addition to the baseplate 102 is present during this sequence, but the other parts of the conventional module are not pictured in order to simplify the diagrams. For illustrative purposes, the convex shape of the baseplate 102 is accentuated in these diagrams. Reference numeral 103 identifies an amount of thermal grease 103. As bolts 104 and 105 are tightened, threads of the bolts engage threads on the inside of the holes in the heatsink 101. The bolt heads therefore exert a downward force on the cylindrical extension portions 106 and 107 as the heatsink is pulled upward toward the bolt heads. As the bolts are tightened further, the baseplate 102 flexes more. FIG. 10 shows the assembly after the bolts have been tightened further and the baseplate has flexed more. FIG. 11 shows the assembly after the bolts have been tightened still further. FIG. 12 illustrates the final condition of the baseplate and heatsink if the recommended maximum torque of three to five newton-meters is used (per screw). Each bolt is tightened until a final maximum turning torque is measured. When rotation of a bolt stops, there remains a gap between the bottom of the baseplate and the top of the heatsink at the edges of the baseplate adjacent the bolt. This gap may be, for example, fifty microns. The gaps adjacent the various bolts may be different on the same module. The gap by one bolt may be different than the gap by another bolt.

Figure 13:
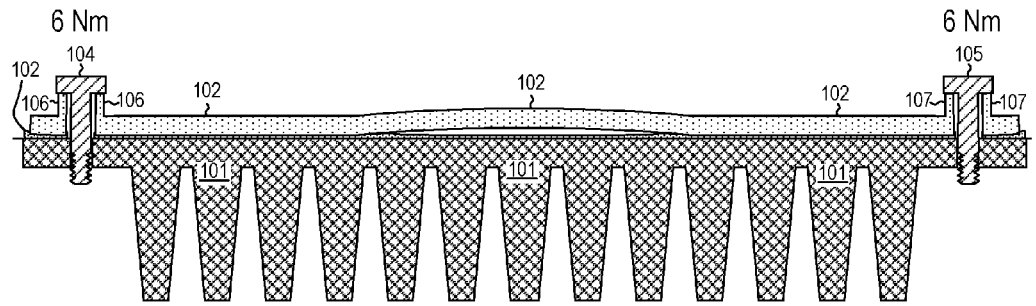
FIG. 13 is s fifth diagram in the sequence of attaching the conventional module to the heatsink.

FIG. 13 illustrates another possible final condition of the baseplate. If each bolt is tightened to a higher torque (for example, from five to six newton-meters of torque on each bolt) then the middle part of the baseplate may flex upward so that the middle part of the baseplate is slightly concave. This results in less thermal contact between the baseplate and the heatsink in this middle concave region of the baseplate.

Figure 14:
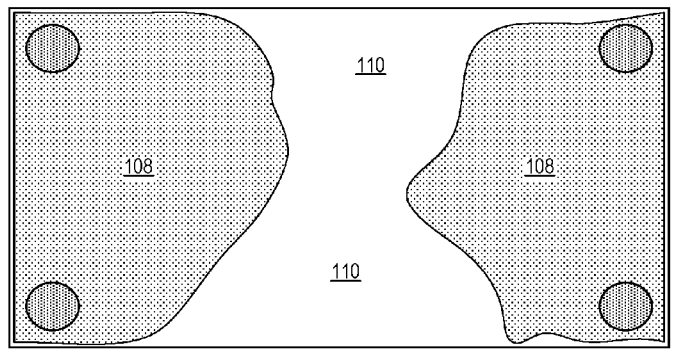
FIG. 14 is a diagram that illustrates a thermal imprint map for the baseplate attachment shown in FIG. 13.
Figure 15:
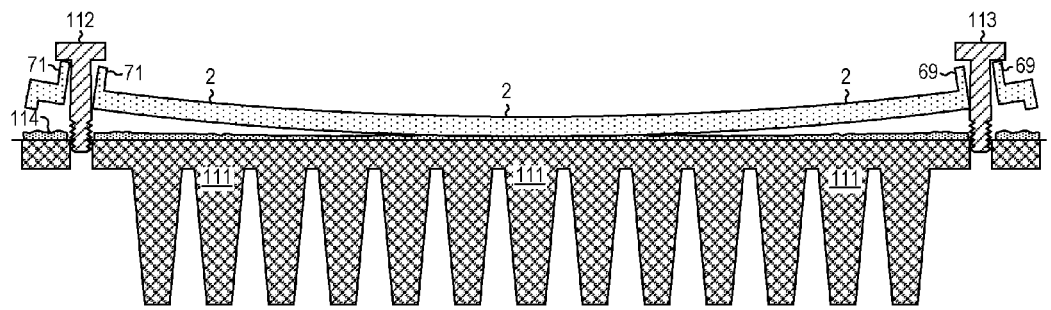
FIG. 15 is a first diagram in a sequence of attaching the novel module of FIG. 1 to a heatsink.
Figure 16:
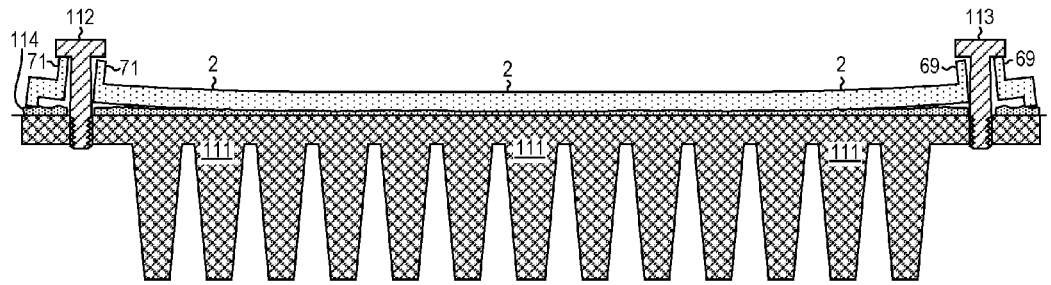
FIG. 16 is a second diagram in the sequence of attaching the novel module of FIG. 1 to the heatsink.

FIG. 14 is a thermal imprint map for the conventional baseplate 102 attachment shown in FIG. 13. The map is of the bottom of the baseplate. For this conventional baseplate, the distance E is approximately twelve centimeters and the G is four hundred microns, and the final turning torque put on each bolt is six newton-meters. The areas 108 and 109 shown in darkened shading are areas of superior thermal transfer, whereas area 110 that is shown as white is an area of inferior thermal transfer.

FIGS. 15-20 are cross-sectional diagrams that illustrate a sequence of attaching the novel baseplate 2 of the novel power semiconductor device module 1 of FIGS. 1-8 to a heatsink 111. Heatsink 111 is not some structure with minimal heatsink capability that simply in some sense can be a sink for some minimal amount of heat, but rather is a metal object with fins and/or other heat radiating extensions designed and provided to radiate heat generated by electronic components. Reference numeral 114 identifies an amount of thermal grease. The novel baseplate 2 is like the conventional baseplate illustrated in connection with FIG. 9 except for the fact that the novel baseplate of FIG. 15 has novel heel extension portions. Accordingly, the diagonal distance E between mounting holes is approximately twelve centimeters. H is one hundred microns. G is four hundred microns. The final turning torque on the bolts is six newton-meters. As the bolts 112 and 113 are tightened down, there is a point of closest contact between a bolt being considered and where the bottom of the baseplate touches the heatsink. As the bolt is tightened, this point of closest contact moves toward the bolt. The distance from this point of closest contact to the bolt can be considered to be a lever arm. For example, in the area of bolt 112, the downward force exerted by the bolt through the level arm involves a counterclockwise torque.

Figure 17:
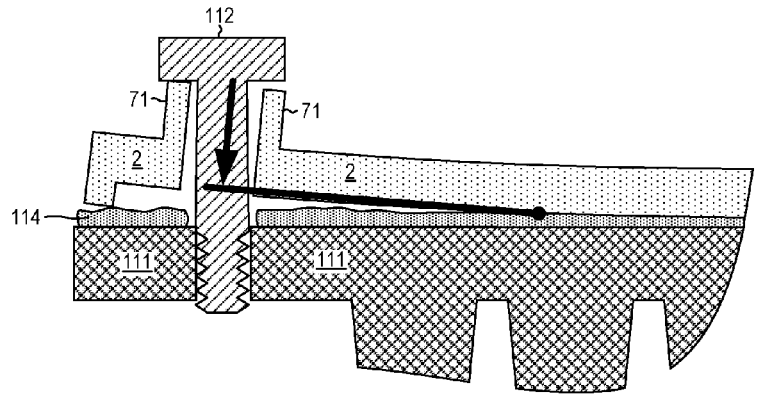
FIG. 17 illustrates a counterclockwise torque that is applied at a point in the sequence of attaching the novel module of FIG. 1 to the heatsink.
Figure 18:
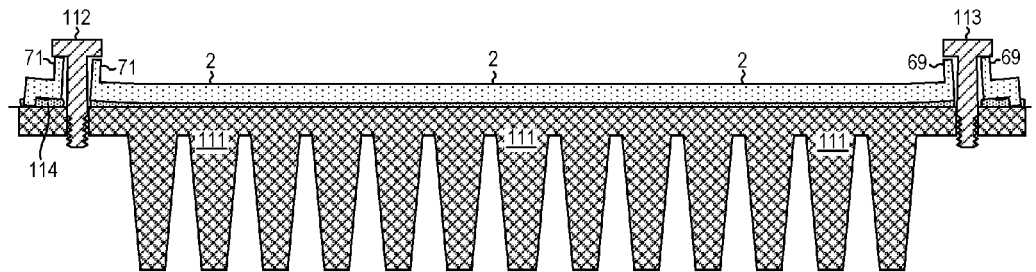
FIG. 18 is another diagram in the sequence of attaching the novel module of FIG. 1 to the heatsink.
Figure 19:
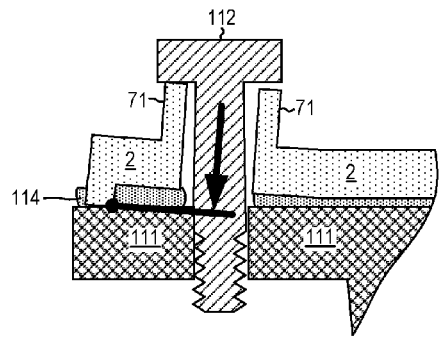
FIG. 19 illustrates a clockwise torque that is applied at another point in the sequence of attaching the novel module of FIG. 1 to the heatsink.

FIG. 17 illustrates this counterclockwise torque. As the bolt 112 is tightened further, point of closest contact moves even closer to the bolt, so the lever arm becomes shorter. This occurs at each of the four bolts. Although not shown here, in reality there is usually a spring washer and a flat washer provided for each bolt. The spring washer deforms under pressure, so there is no visible gap between the bottom surface of the bolt head and the top surface of the upward-extending cylindrical portion 71. As the bolts are tightened further and the baseplate flexes further, the heel extension portions make contact with the top of the heatsink as shown in FIG. 18. As bolt 112 is tightened further, the flexing of the baseplate in the area of bolt 112 involves a clockwise torque as illustrated in FIG. 19. This clockwise torque improves contact between the baseplate and the heatsink, even at a maximum torque of six newton-meters. By this improvement, the center part of the baseplate is contacting the heatsink even better and a concave final condition (FIG. 13) will not occur.

Figure 20:
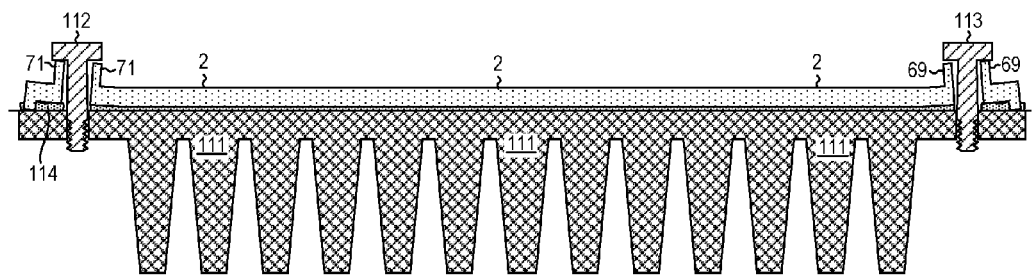
FIG. 20 is another diagram in the sequence of attaching the novel module of FIG. 1 to the heatsink.

FIG. 20 illustrates the final condition in which the tightening of each bolt is stopped at the same turning torque of three to six newton-meters. The heel extension portions at the left short side of the baseplate are contacting the top of the heatsink at the left, and the heel extension portions at the right short side of the baseplate are contacting the top of the heatsink at the right.

Figure 21:
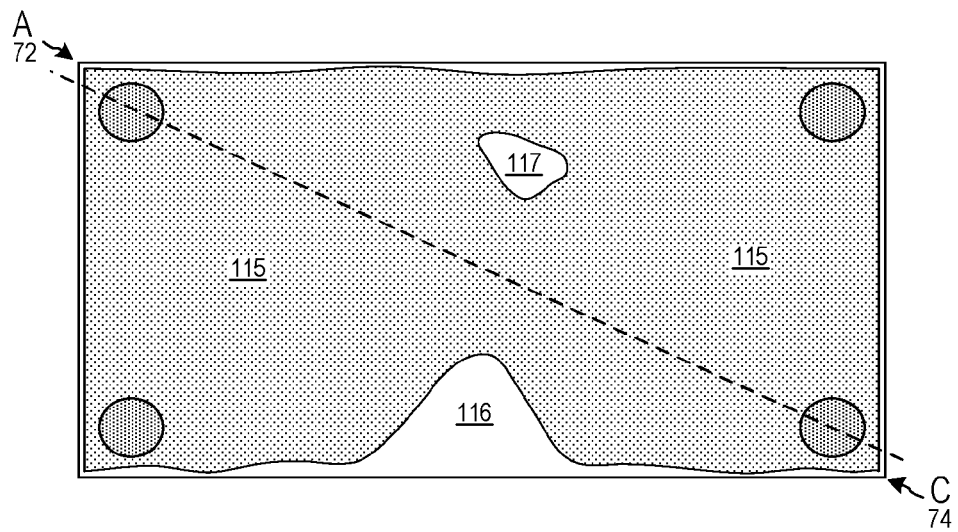
FIG. 21 is a diagram that illustrates a thermal imprint map for a first test attachment of the novel module of FIG. 1.

FIG. 21 is a thermal imprint map diagram for a first test module of the type of FIG. 1 that is attached to a heatsink in accordance with FIGS. 15-20. The map is of the bottom of the baseplate but the heel extension portions are not illustrated. Area 115 shown in darkened shading is an area of superior thermal transfer, whereas areas 116 and 117 that are shown as white are areas of inferior thermal transfer.

Figure 22:
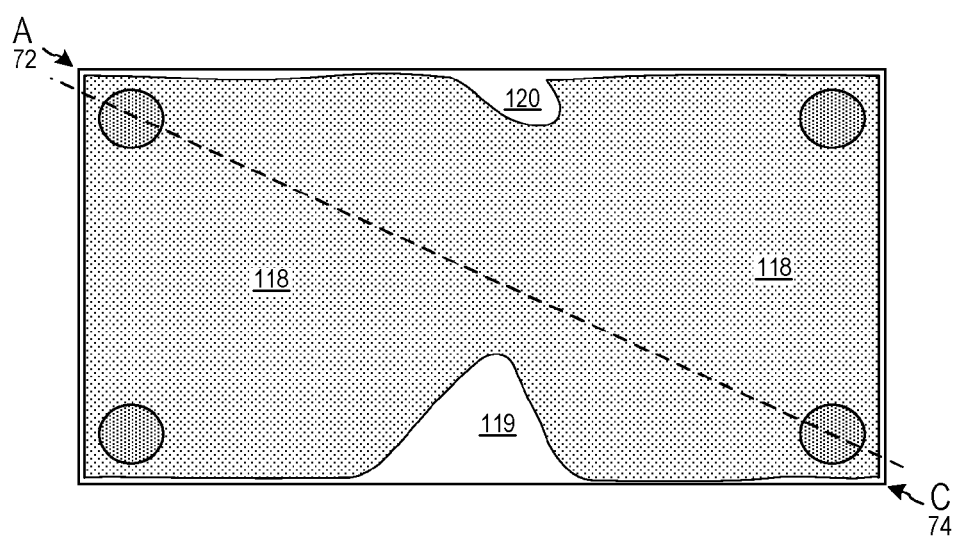
FIG. 22 is a diagram that illustrates a thermal imprint map for a second test attachment of the novel module of FIG. 1.

FIG. 22 is a thermal imprint map diagram for a second test module of the type of FIG. 1 that is attached to a heatsink in accordance with FIGS. 15-20. The map is of the bottom of the baseplate but the heel extension portions are not illustrated. Area 118 shown in darkened shading is an area of superior thermal transfer, whereas areas 119 and 120 that are shown as white are areas of inferior thermal transfer. The first and second test modules of FIG. 21 and FIG. 22 are of identical construction and are attached in identical fashion as outlined in FIGS. 15-20. The areas shown in darkened shading are areas of superior thermal transfer, whereas areas that are shown as white are areas of inferior thermal transfer. Note that the thermal imprint maps of FIGS. 21 and 22 show much improved thermal contact between baseplate and heatsink as compared to the thermal imprint map of FIG. 14.

The thermal imprint map diagrams of FIGS. 21 and 22 were made using an unusually thin layer of thermal grease that was only twenty microns thick, whereas the recommended normal thickness of the thermal grease layer would be about forty microns. The unusually thin layer of thermal grease was used in order to accentuate and to help reveal the areas of poorer thermal contact between baseplate and heatsink.

Figure 23:
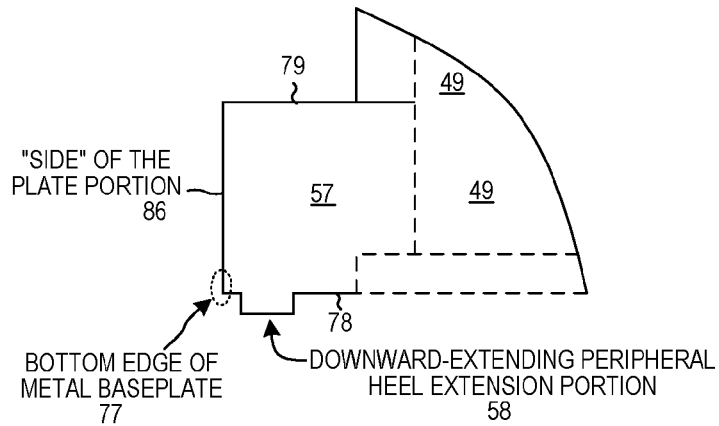
FIG. 23 is a cross-sectional side view of a part of a baseplate that has downward-extending heel extension portions in accordance with another embodiment.

FIG. 23 is a cross-sectional diagram similar to FIG. 6, but in the case of FIG. 23 the downward-extending peripheral heel extension portion 58 is slightly inset from the left side 86 of the plate portion 57 of the baseplate 2. Both examples of heel extension portions illustrated in FIG. 23 and in FIG. 6 are said to be heel extension portions that extend downward from the bottom surface 78 of the plate portion 57 "at" the side 86 of the plate portion 57. The heel extension portions of FIG. 23 and of FIG. 6 are both said to extend "along" the bottom edge 77.

Figure 24:
FIG. 24 is a top-down diagram of a baseplate in accordance with another embodiment.

FIG. 24 is a top-down diagram that shows another embodiment of the baseplate 2. In this embodiment, there is one elongated strip-shaped heel extension portion 121 that extends downward at the left side 86 of the plate portion, and there is one elongated strip-shaped heel extension portion 122 that extends downward at the second side 88 of the plate portion.

Figure 25:
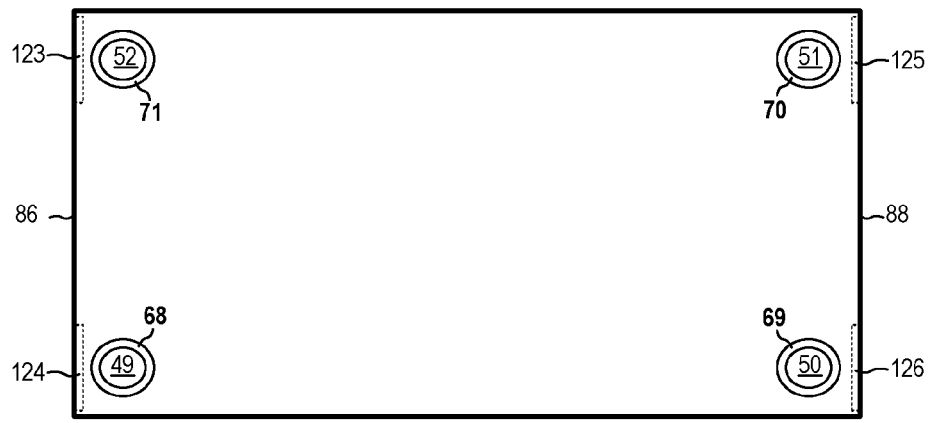
FIG. 25 is a top-down diagram of a baseplate in accordance with another embodiment.

FIG. 25 is a top-down diagram that shows another embodiment of the baseplate 2. In this embodiment, there are two downward-extending heel extension portions 123 and 124 that extend downward at the left side 86 of the plate portion, and there are two downward-extending heel extension portions 125 and 126 that extend downward at the second side 88 of the plate portion.

Figure 26:
FIG. 26 is a top-down diagram of a baseplate in accordance with another embodiment.

FIG. 26 is a top-down diagram that shows another embodiment of the baseplate 2. Despite the thin cut-ins into each of its four sides, and despite the rounded corners of the baseplate, the baseplate of FIG. 26 from the top-down perspective is nevertheless substantially rectangular. In this embodiment, there are three downward-extending heel extension portions 127-129 that extend downward at the left side 86 of the plate portion. The left side 86 of the plate portion does not extend entirely in one plane, but rather the left side 86 includes multiple planar faces 130-134. The left bottom edge of the bottom surface of the baseplate is not a straight line in this example, but the downward-extending heel extension portions 127-129 nevertheless extend along this edge. Likewise, there are three downward-extending heel extension portions 135-137 that extend downward at the right side 88 of the plate portion. The right side 88 of the plate portion does not extend entirely in one plane, but rather the right side 88 includes multiple planar faces 138-142. The right bottom edge of the bottom surface of the baseplate is not a straight line in this example, but the downward-extending heel extension portions 135-137 nevertheless extend along this edge. In a case where the baseplate 2 of FIG. 26 is employed, the plastic housing frame may have four downward-extending curtain portions, one along each of the four bottom edges of the plastic housing frame. Each downward-extending curtain portion of the plastic housing frame extends down into a corresponding one of the cut-in areas on a side of the baseplate. For each such curtain portion there is a corresponding cut-in area. The plastic housing frame and the baseplate fit together in this way (with a curtain portion fitting down into its associated cut-in area) such that the housing is retained, in the lateral dimension, from being laterally displaced with respect to the baseplate.

Although certain specific embodiments are described above for instructional purposes, the teachings of this patent document have general applicability and are not limited to the specific embodiments described above. The heel extension portions need not be made is a press-forming operation, but rather may be formed in a machining operation. The baseplate can also be made by attaching heel extension portion to a plate portion so as to make the overall baseplate. The baseplate can be integrally formed as a unitary piece of metal, or it can be made up of multiple parts. The heel extension portions can take various forms. An individual heel extension portion need not have an elongated strip shape. Accordingly, various modifications, adaptations, and combinations of various features of the described embodiments can be practiced without departing from the scope of the invention as set forth in the claims.

What is claimed is:

1. A power semiconductor device module baseplate comprising:
a substantially rectangular plate portion, wherein the plate portion has a width of at least two centimeters, a length of at least six centimeters, a bottom surface and four sides, wherein the bottom surface has a slightly convex downward shape, wherein a first side of the plate portion is opposite to a second side of the plate portion, wherein there is at least one mounting hole adjacent the first side of the plate portion and there is at least one mounting hole adjacent the second side of the plate portion;
a first downward-extending peripheral heel extension portion, wherein the first downward-extending peripheral heel extension portion extends downward from the bottom surface of the plate portion at the first side of the plate portion for a distance of more than thirty microns and less than five hundred microns; and
a second downward-extending peripheral heel extension portion, wherein the second downward-extending peripheral heel extension portion extends downward from the bottom surface of the plate portion at the second side of the plate portion for a distance of more than thirty microns and less than five hundred microns, wherein the first downward-extending peripheral heel extension portion is one of a first plurality of downward-extending peripheral heel extension portions, wherein the downward-extending peripheral heel extension portions of the first plurality are collinear with respect to one another and are aligned along a first bottom edge of the power semiconductor device module baseplate, wherein the second downward-extending peripheral heel extension portion is one of a second plurality of downward-extending peripheral heel extension portions, wherein the downward-extending peripheral heel extension portions of the second plurality are collinear with respect to one another and are aligned along a second bottom edge of the power semiconductor device module baseplate, wherein each downward-extending peripheral heel extension portion of the first plurality of downward-extending peripheral heel extension portions is a separate and distinct downward-extending peripheral heel extension portion with respect to each of the other downward-extending peripheral heel extension portions of the first plurality of downward-extending peripheral heel extension portions, and wherein each downward-extending peripheral heel extension portion of the second plurality of downward-extending peripheral heel extension portions is a separate and distinct downward-extending peripheral heel extension portion with respect to each of the other downward-extending peripheral heel extension portions of the second plurality of downward-extending peripheral heel extension portions.

2. A power semiconductor device module baseplate comprising:
a substantially rectangular plate portion, wherein the plate portion has a width of at least two centimeters, a length of at least six centimeters, a bottom surface and four sides, wherein the bottom surface has a slightly convex downward shape, wherein a first side of the plate portion is opposite to a second side of the plate portion, wherein there is at least one mounting hole adjacent the first side of the plate portion and there is at least one mounting hole adjacent the second side of the plate portion;
 a first downward-extending peripheral heel extension portion, wherein the first downward-extending peripheral heel extension portion extends downward from the bottom surface of the plate portion at the first side of the plate portion for a distance of more than thirty microns and less than five hundred microns; and
 a second downward-extending peripheral heel extension portion, wherein the second downward-extending peripheral heel extension portion extends downward from the bottom surface of the plate portion at the second side of the plate portion for a distance of more than thirty microns and less than five hundred microns, wherein the first downward-extending peripheral heel extension portion is one of a first plurality of downward-extending peripheral heel extension portions, wherein the downward-extending peripheral heel extension portions of the first plurality are aligned along a first bottom edge of the power semiconductor device module baseplate, wherein the second downward-extending peripheral heel extension portion is one of a second plurality of downward-extending peripheral heel extension portions, wherein the downward-extending peripheral heel extension portions of the second plurality are aligned along a second bottom edge of the power semiconductor device module baseplate, wherein each downward-extending peripheral heel extension portion of the first plurality of downward-extending peripheral heel extension portions is a separate and distinct downward-extending peripheral heel extension portion with respect to each of the other downward-extending peripheral heel extension portions of the first plurality of downward-extending peripheral heel extension portions, and wherein each downward-extending peripheral heel extension portion of the second plurality of downward-extending peripheral heel extension portions is a separate and distinct downward-extending peripheral heel extension portion with respect to each of the other downward-extending peripheral heel extension portions of the second plurality of downward-extending peripheral heel extension portions.

3. The power semiconductor device module baseplate of claim 2, wherein the plate portion, the first plurality of downward-extending peripheral heel extension portions, and the second plurality of downward-extending peripheral heel extension portions are all parts of the same single unitary piece of metal.

4. The power semiconductor device module baseplate of claim 3, wherein the first side of the plate portion extends entirely in a first plane, and wherein the second side of the plate portion extends entirely in a second plane.

5. The power semiconductor device module baseplate of claim 3, wherein the first side of the plate portion extends in a first plurality of planes, and wherein the second side of the plate portion extends in a second plurality of planes.

6. The power semiconductor device module baseplate of claim 3, wherein there are four mounting holes in the plate portion, and wherein there is no downward-extending peripheral heel extension portion located anywhere between any two of the four mounting holes.

7. The power semiconductor device module baseplate of claim 3, wherein there are two and only two mounting holes in the plate portion, and wherein there is no downward-extending peripheral heel extension portion located anywhere between the two mounting holes.

8. The power semiconductor device module baseplate of claim 3, wherein a semiconductor die is directly soldered to the plate portion.

9. The power semiconductor device module baseplate of claim 3, wherein a DMB (Direct Metal Bonded) structure is mounted to the plate portion.

10. The power semiconductor device module baseplate of claim 3, wherein the substantially rectangular plate portion is at least two millimeters thick.

11. The power semiconductor device module baseplate of claim 3, wherein each of the downward-extending peripheral heel extension portions of the first plurality of downward-extending peripheral heel extension portions and of the second plurality of downward-extending peripheral heel extension portions has a width, wherein the width is not more than three millimeters.

12. The power semiconductor device module baseplate of claim 3, wherein each downward-extending peripheral heel extension portion of the first plurality of downward-extending peripheral heel extension portions is slightly inset from the first side of the plate portion, and wherein each downward-extending peripheral heel extension portion of the second plurality of downward-extending peripheral heel extension portions is slightly inset from the second side of the plate portion.

13. A power semiconductor device module, wherein the power semiconductor device module has a first lateral side edge and a second lateral side edge, the power semiconductor device module comprising:
 a metal baseplate comprising a substantially rectangular plate portion and a first downward-extending peripheral heel extension portion and a second downward-extending peripheral heel extension portion, wherein the metal baseplate has a substantially rectangular shape and four corners when the metal baseplate is considered from a top-down perspective, wherein there are at least two mounting holes in the metal baseplate, wherein the plate portion of the metal baseplate has a bottom surface, wherein the first downward-extending peripheral heel extension portion extends downward from the bottom surface of the plate portion at a first bottom edge of the metal baseplate, and wherein the second downward-extending peripheral heel extension portion extends downward from the bottom surface of the plate portion at a second bottom edge of the metal baseplate, wherein the first downward-extending peripheral heel extension portion is disposed at the first lateral side edge of the power semiconductor device module, wherein the second downward-extending peripheral heel extension portion is disposed at the second lateral side edge of the power semiconductor device module, wherein the bottom surface of the plate portion extends in a plane;
 a housing frame of an insulative plastic material, wherein the housing frame fits down onto and engages a top surface of the metal baseplate such that the metal baseplate and the housing frame together form a shallow tray, wherein the shallow tray has an upper rim, wherein the housing frame is disposed entirely above the plane of the bottom surface of the plate portion when the bottom surface is taken at the first and second lateral side edges of the power semiconductor device module;

a power semiconductor device disposed in the shallow tray, wherein the power semiconductor device is taken from the group consisting of: a power diode, a power field effect transistor, a power insulated gate field effect transistor, a power bipolar transistor, a power thyristor;

a cap of an insulative plastic material that fits down onto the upper rim; and a plurality of electrical terminals, wherein each electrical terminal has a pin portion that extends upward such that the pin portion extends upward and away from the cap in a direction perpendicular to the bottom surface of the metal baseplate.

14. The power semiconductor device module of claim 13, wherein a central portion of the bottom surface of the baseplate has a convex downward shape.

15. The power semiconductor device module of claim 14, wherein the first bottom edge of the baseplate extends in a first line, wherein the second bottom edge of the metal baseplate extends in a second line, and wherein the first and second lines are parallel to one another.

16. The power semiconductor device module of claim 15, wherein the first downward-extending peripheral heel extension portion is one of a first plurality of downward-extending peripheral heel extension portions, wherein the downward-extending peripheral heel extension portions of the first plurality are collinear with respect to one another and are aligned along the first bottom edge of the metal baseplate, wherein the second downward-extending peripheral heel extension portion is one of a second plurality of downward-extending peripheral heel extension portions, wherein the downward-extending peripheral heel extension portions of the second plurality are collinear with respect to one another and are aligned along the second bottom edge of the metal baseplate.

\* \* \* \* \*